(12) United States Patent
Aoyama et al.

(10) Patent No.: US 7,868,376 B2
(45) Date of Patent: Jan. 11, 2011

(54) SEMICONDUCTOR STORAGE DEVICE AND METHOD FOR MANUFACTURING THE SAME

(75) Inventors: Kenji Aoyama, Yokohama (JP); Hisataka Meguro, Yokkaichi (JP); Satoshi Nagashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 171 days.

(21) Appl. No.: 12/354,271

(22) Filed: Jan. 15, 2009

(65) Prior Publication Data

US 2009/0218614 A1 Sep. 3, 2009

(30) Foreign Application Priority Data

Mar. 3, 2008 (JP) .............................. 2008-052185

(51) Int. Cl.
*H01L 29/792* (2006.01)
(52) U.S. Cl. ................................ 257/324; 257/E29.127
(58) Field of Classification Search .................. 257/208, 257/305, 324, 513, 522, E29.127
See application file for complete search history.

(56) References Cited

U.S. PATENT DOCUMENTS

| 6,353,242 | B1 * | 3/2002 | Watanabe et al. ........... 257/316 |
| 7,045,849 | B2 | 5/2006 | Chen et al. |
| 2004/0232496 | A1 | 11/2004 | Chen et al. |
| 2006/0001073 | A1 | 1/2006 | Chen et al. |
| 2006/0194390 | A1 | 8/2006 | Imai et al. |
| 2006/0231884 | A1 | 10/2006 | Yonemochi et al. |
| 2007/0063256 | A1 | 3/2007 | Imai et al. |
| 2007/0096202 | A1 | 5/2007 | Kang et al. |
| 2007/0184615 | A1 | 8/2007 | Brazzelli et al. |

(Continued)

FOREIGN PATENT DOCUMENTS

JP 01-137651 5/1989

(Continued)

OTHER PUBLICATIONS

Kang et al.; "The Air Spacer Technology for Improving the Cell Distribution in 1 Giga Bit Nand Flash Memory"; IEEE, pp. 36-37, (2006).

(Continued)

*Primary Examiner*—Quoc D Hoang
(74) *Attorney, Agent, or Firm*—Finnegan, Henderson, Farabow, Garrett & Dunner, L.L.P.

(57) ABSTRACT

A semiconductor storage device has a plurality of word lines formed with a predetermined interval on a semiconductor substrate, a selection transistor provided at an end portion of the plurality of word lines, a first insulating film formed so as to cover side surfaces of the word lines, a side surface of the selection transistor, and a surface of the semiconductor substrate between the word lines, a high-permittivity film formed on the first insulation film, a second insulating film formed so as to cover the upper surface of the word lines and the selection transistor, a first air-gap portion located between the word lines and surrounded by the high-permittivity film and the second insulating film, and a second air-gap portion formed via the first insulating film and the high-permittivity film at a sidewall portion, which opposes the selection transistor, of the word line adjacent to the selection transistor, an upper portion of the second air-gap portion being covered by the second insulating film.

5 Claims, 13 Drawing Sheets

U.S. PATENT DOCUMENTS

2008/0003724 A1    1/2008    Cho et al.

FOREIGN PATENT DOCUMENTS

| JP | 2002-110930 | 4/2002 |
| JP | 2003-209247 | 7/2003 |
| JP | 2007-150068 | 6/2007 |
| JP | 2008-47630 | 2/2008 |

OTHER PUBLICATIONS

Notification of Reasons for Rejection issued by the Japanese Patent Office on Jul. 16, 2010, for Japanese Patent Application No. 2008-052185, and English-language translation thereof.

* cited by examiner

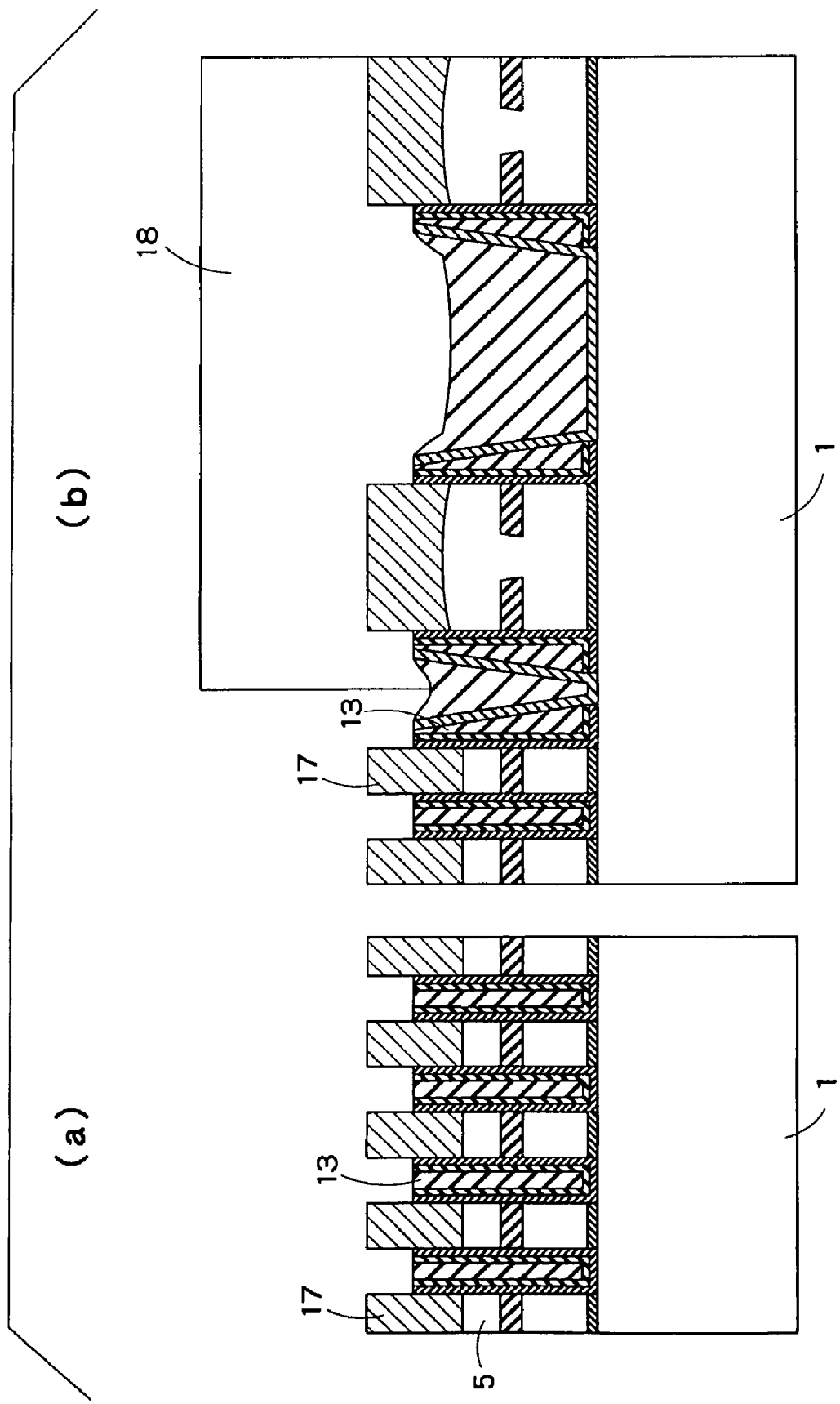
F I G. 6

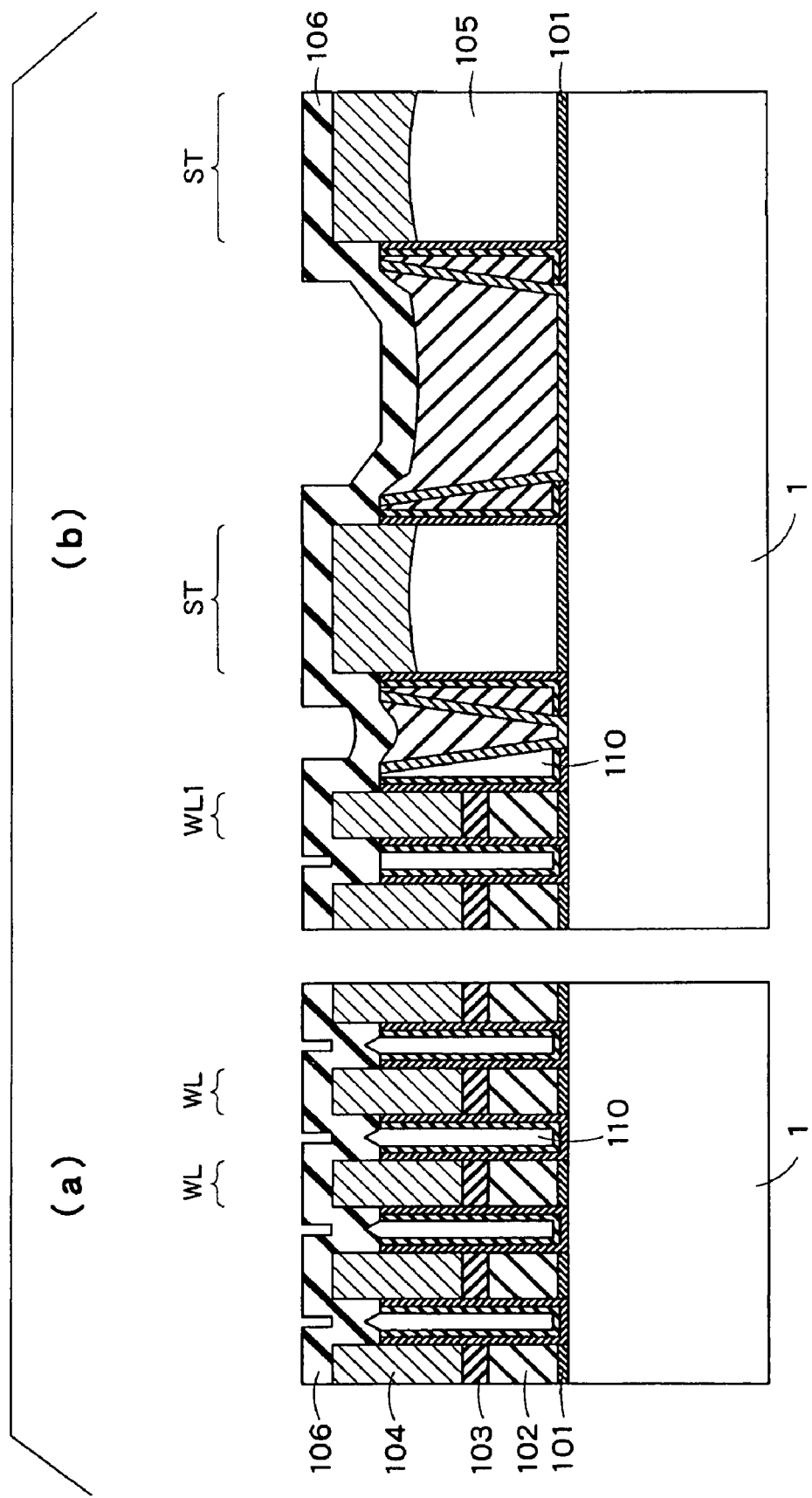
F I G. 12

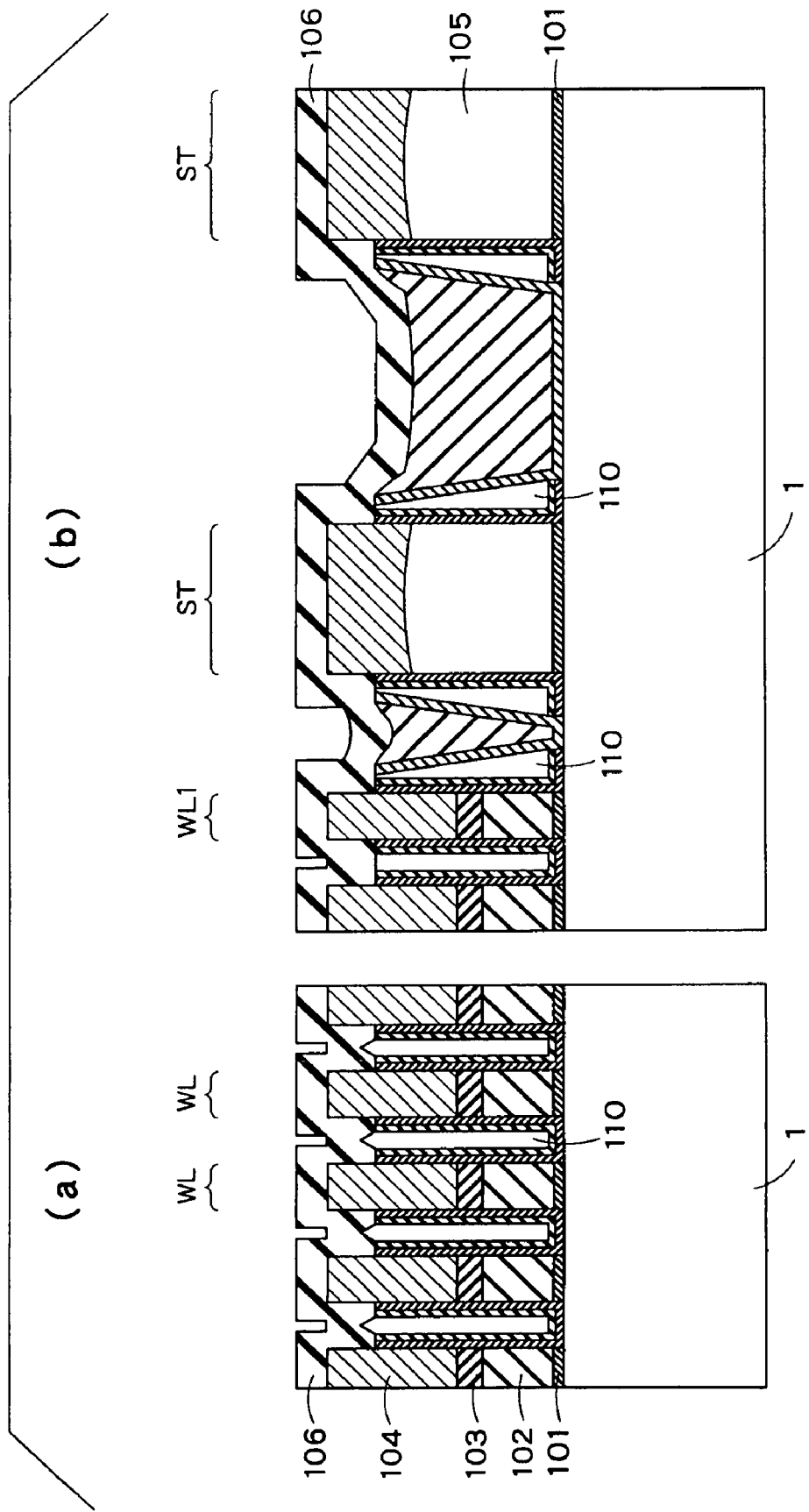
F I G. 13

SEMICONDUCTOR STORAGE DEVICE AND METHOD FOR MANUFACTURING THE SAME

CROSS REFERENCE TO RELATED APPLICATION

This application is based upon and claims benefit of priority from the Japanese Patent Application No. 2008-52185, filed on Mar. 3, 2008, the entire contents of which are incorporated herein by reference.

BACKGROUND OF THE INVENTION

The invention relates to a semiconductor storage device and a method for manufacturing the same.

In conventional non-volatile semiconductor storage devices, regions between word lines that have a layer structure including a tunnel oxide film, a floating gate electrode, an interpoly insulating film, and a control gate electrode are filled using an oxide film or a nitride film. However, as devices have shrunk to microscopic sizes, various problems have arisen. One problem is that because the interval between the word lines has been reduced, variation among threshold voltages of the floating gate electrodes has increased due to parasitic capacitances generated between the floating gate electrodes of adjacent word lines, and writing speed has dropped due to parasitic capacitances generated between the floating gates and diffusion layer. Another problem is that the material embedded between the electrodes breaks down as a result of the large electric field applied between the electrodes.

One proposed solution for such problems is to provide air gaps (spaces) between the word lines to reduce the parasitic capacitances thereby suppress the variation in the threshold voltages of the floating gate electrodes and the reduction in the writing speed.

A known method for forming air gaps is to use an organic material as a sacrificial film and remove the sacrificial film by ashing (see, for example, Japanese Patent Laid-Open No. 1-137651). However, when such a method is applied to form the air gap between the word lines, there is a problem that the carbon or the like included in the organic material degrades the tunnel oxide film.

A further known method of forming the air gaps is to form a spacer made up of a silicon nitride film to cover the word line, form a sacrificial film made up of a silicon oxide film up to a predetermined height between the word lines, form a mini-spacer made up of a silicon nitride film on the sacrificial film, and remove the sacrificial film while preserving a selection ratio between the sacrificial film and the silicon nitride film (see, for example, Daewoong Kang et al, The Air Spacer Technology for Improving the Cell Distribution in 1 Giga Bit NAND Flash Memory, IEEE NVSMW2006, p 36-p 37).

However, this method has a problem in that hot carriers are generated when a silicon nitride film is used as a spacer. A further problem is that hydrogen included in the silicon nitride film during the heating process causes degradation of the tunnel oxide film.

Thus, conventional methods for forming the air gap have a problem in that the tunnel oxide film is degraded, causing a drop in the reliability of the semiconductor storage device.

SUMMARY OF THE INVENTION

According to one aspect of the present invention, there is provided a semiconductor storage device comprising:

a semiconductor substrate;

a plurality of word lines formed with a predetermined interval on the semiconductor substrate;

a selection transistor provided at an end portion of the plurality of word lines;

a first insulating film formed so as to cover side surfaces of the word lines, a side surface of the selection transistor, and a surface of the semiconductor substrate between the word lines;

a high-permittivity film formed on the first insulation film, the high-permittivity film including a metal oxide and having a higher permittivity than the first insulating film;

a second insulating film formed so as to cover the upper surface of the word lines and the selection transistor;

a first air-gap portion located between the word lines and surrounded by the high-permittivity film and the second insulating film; and a second air-gap portion formed via the first insulating film and the high-permittivity film at a sidewall portion, which opposes the selection transistor, of the word line adjacent to the selection transistor, an upper portion of the second air-gap portion being covered by the second insulating film.

According to one aspect of the present invention, there is provided a semiconductor storage device manufacturing method comprising:

forming on a semiconductor substrate a plurality of word lines separated by a predetermined interval, each including a first insulating film, a charge storing layer, a second insulating film and a control gate electrode layered in the stated order, and a selection transistor at each end of each of the plurality of word lines at a location adjacent to a plurality of memory regions;

forming a first oxide film so as to cover the word lines, the selection transistors and the semiconductor substrate;

forming, on the first oxide film, a high-permittivity film which includes a metal oxide and has a higher permittivity than the first oxide film;

forming a second oxide film on the high-permittivity film so as to be embedded in gaps between the word lines;

removing the second oxide film, the high-permittivity film and the first oxide film so as to expose a surface of the semiconductor substrate between adjacent selection transistors and a surface of the semiconductor substrate between the selection transistors and the word lines adjacent to the selection transistors, and forming a sidewall films made up of the first oxide film, the high-permittivity film and the second oxide film on sidewall portions of the selection transistors and on sidewall portions which are of the word lines adjacent to the selection transistors and oppose the selection transistors;

forming a nitride film so as to cover the sidewall films and the semiconductor substrate;

forming a third oxide film so as to be embedded between the selection transistors and between the selection transistors and the word line adjacent to the selection transistors;

removing the third oxide film and the nitride film so as to expose upper surfaces of the control gate electrodes and an upper surface of the second oxide film;

removing the second oxide film; and forming a fourth oxide film so as to cover an upper portion of regions from which the second oxide film has been removed.

BRIEF DESCRIPTION OF THE DRAWINGS

FIG. 6 is a cross-sectional view showing a step subsequent to FIG. 5;

FIG. 12 is a schematic view of the semiconductor storage device according to a modification; and FIG. 13 is a schematic view of the semiconductor storage device according to the modification.

DESCRIPTION OF THE EMBODIMENTS

Figure 1:
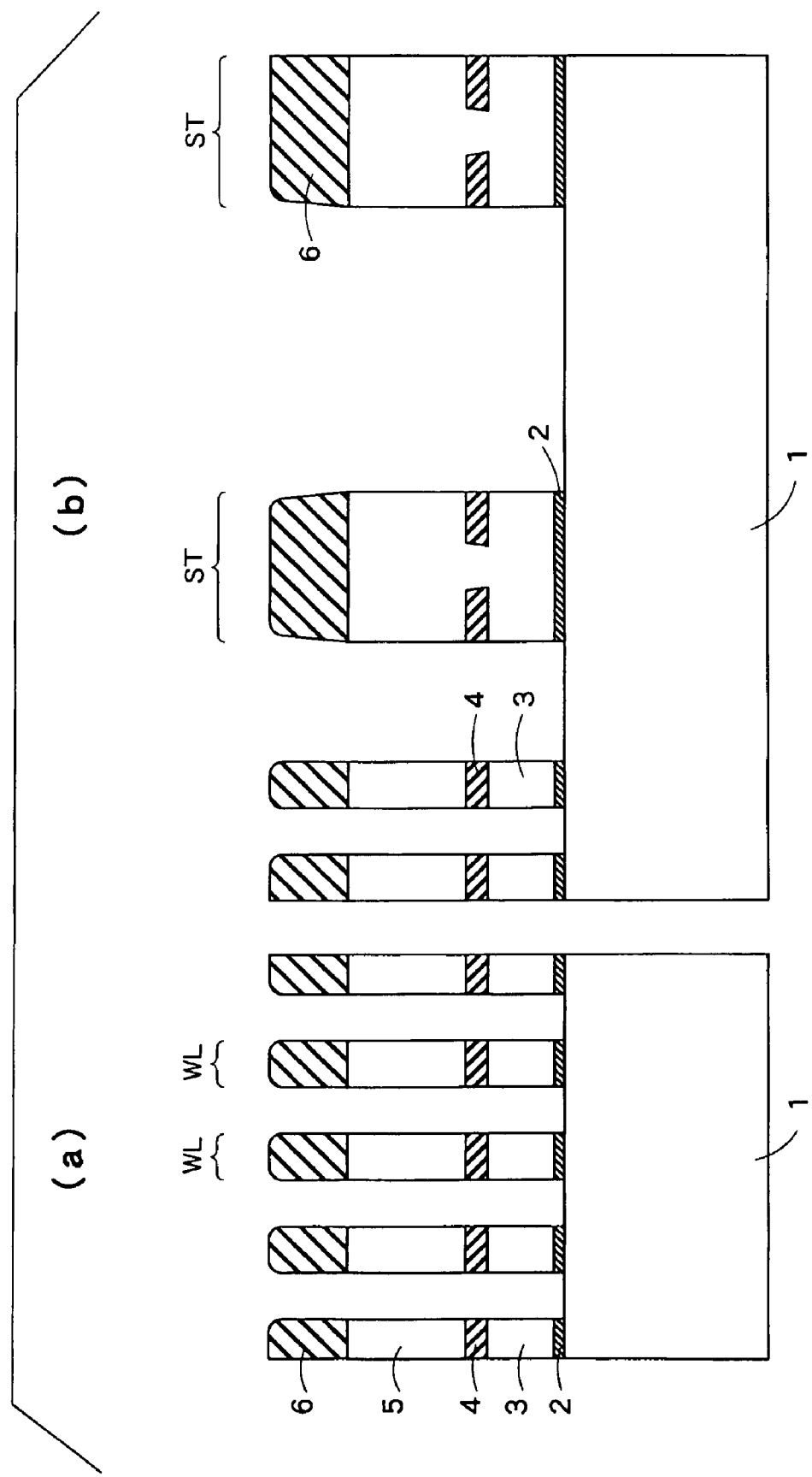
FIG. 1 is a cross-sectional view for explaining a manufacturing method of a semiconductor storage device according to an embodiment of the invention.

The following describes embodiments of the invention with reference to the drawings.

FIGS. 1 to 8 are process cross-sectional drawings for explaining a manufacturing method of a semiconductor storage device according to an embodiment of the invention. In the drawings (a) is a vertical cross-section of a memory cell array portion taken along a bit line and (b) is a vertical cross-section of an end portion of the memory cell array and selection gate transistor, taken along a bit line.

As shown in FIG. 1, a tunnel oxide film 2 made up of a silicon oxide film and a floating gate electrode 3 formed from a polysilicon film are formed on a semiconductor substrate 1.

The floating gate electrode 3, the tunnel oxide film 2, and the semiconductor substrate 1 are then removed at a predetermined interval in a first direction (bit line direction) to form grooves. A silicon oxide film of a predetermined height is embedded in the grooves to form device separation regions (not shown).

The interpoly insulating film 4 is then formed so as to cover the floating gate electrodes 3 and the device separation regions, and a first polysilicon film is formed on the interpoly insulating film 4. Portions of the first polysilicon film and the interpoly insulating film 4 in regions which are to be formed into selection transistors ST and peripheral transistors (not shown in the drawings) are removed to form grooves. A second polysilicon film is formed on the first polysilicon film so as to be embedded in the grooves.

In the memory cell array portion, a control gate electrode 5 is made up of the first polysilicon film and the second polysilicon film. Further, the selection transistors ST and the peripheral transistors have an etching interpoly structure in which the polysilicon film (electrode film) above and below the interpoly insulating film 4 are connected.

A silicon nitride film 6 is then formed on the control gate electrode 5. Next, the word lines WL and the selection transistors ST are fabricated by removing, with a predetermined interval in a second direction (word line direction) perpendicular to the first direction, the silicon nitride film 6, the control gate electrode 5, the interpoly insulating film 4, the floating gate electrode 3 and the tunnel oxide film 2. A selection transistor ST is provided at each end of each of the plurality of word lines WL.

Figure 2:
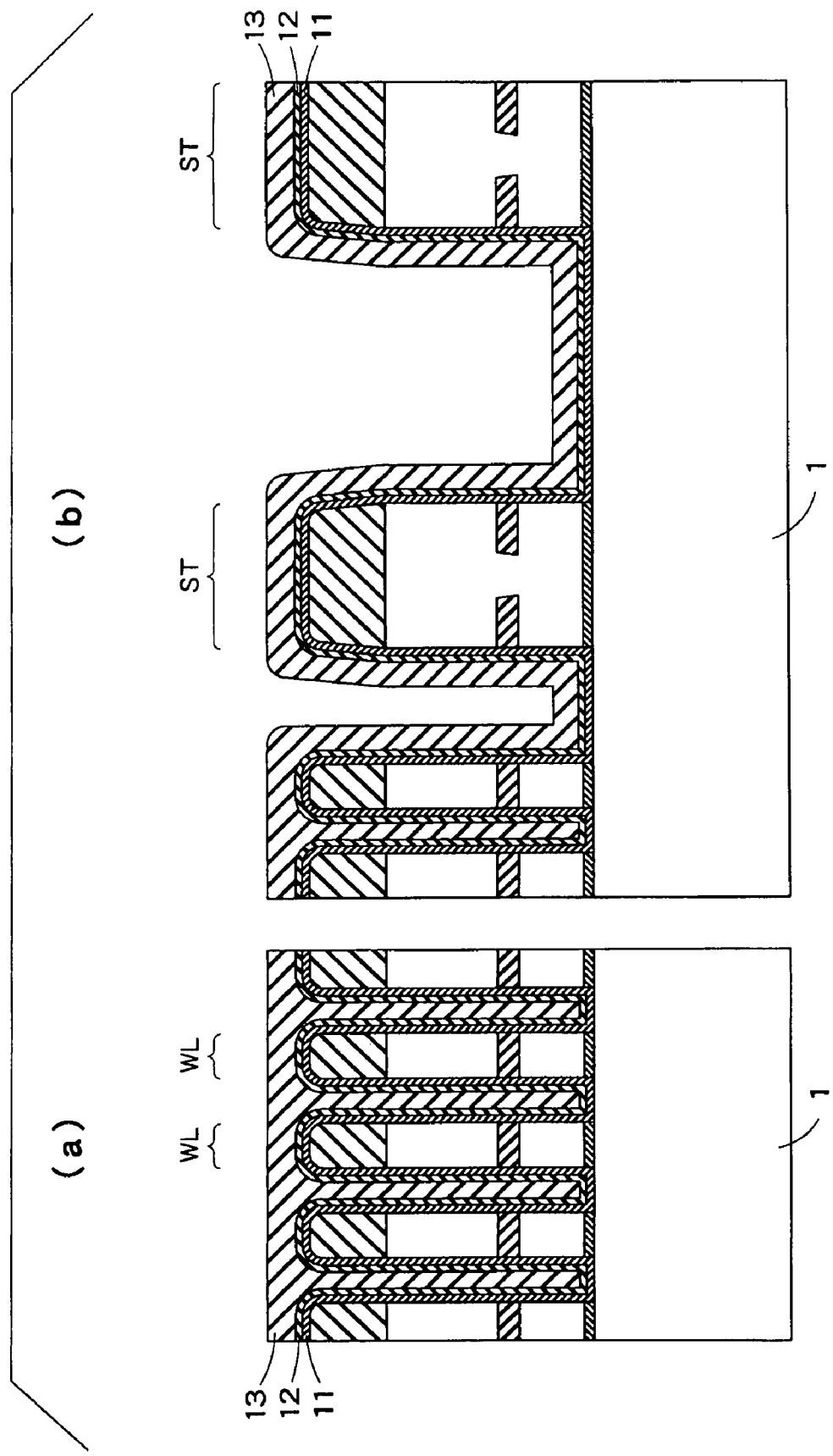
FIG. 2 is a cross-sectional view showing a step subsequent to FIG. 1.

As shown in FIG. 2, a silicon oxide film 11 is formed so as to cover the word lines WL, the selection transistors ST, and the semiconductor substrate 1 using a CVD (Chemical Vapor Deposition) method. The silicon oxide film 11 is formed using a high temperature (e.g. 750° C. or more). After formation, the silicon oxide film 11 is heat treated (densification processing) at high temperature for a predetermined period. According to this process, the silicon oxide film 11 becomes a high-density film. The densification processing may be performed in a conventional oven or by RTA (Rapid Thermal Annealing).

Diffusion layers (not shown in the drawings) are then formed by implanting arsenic or the like in surface portions of the semiconductor substrate 1 between the word lines WL, between the selection transistors ST, and between the selection transistors ST and a word line WL1 adjacent to the selection transistors ST.

A high-permittivity film 12, which has a higher permittivity than the silicon oxide film 11, is formed on the silicon oxide film 11 by ALD (Atomic Layer Deposition) method. Examples of materials which can be used as the high-permittivity film 12 include metal oxides including Zr oxides such as $ZrO_2$, $PbZrO_2$, $BaZrO_3$, Hf oxides such as $HfO_2$, HfON, and HfAlO, La oxides such as $LaO_3$, Al oxides such as $Al_2O_3$ and $AlZrO_5$, Ta oxides such as $Ta_2O_5$, Ti oxides such as $TiO_2$ and Y oxides such as $Y_2O_3$.

Next, a sacrificial film 13 made up of a silicon oxide film is formed by a CVD method so as to be embedded between the word lines WL on the high-permittivity film 12. The sacrificial film 13 is formed into a film at lower temperature (e.g. 650° C. or less) than the temperature at which the silicon oxide film 11 is formed. Consequently, the sacrificial film 13 has a lower density than the silicon oxide film 11.

Figure 3:
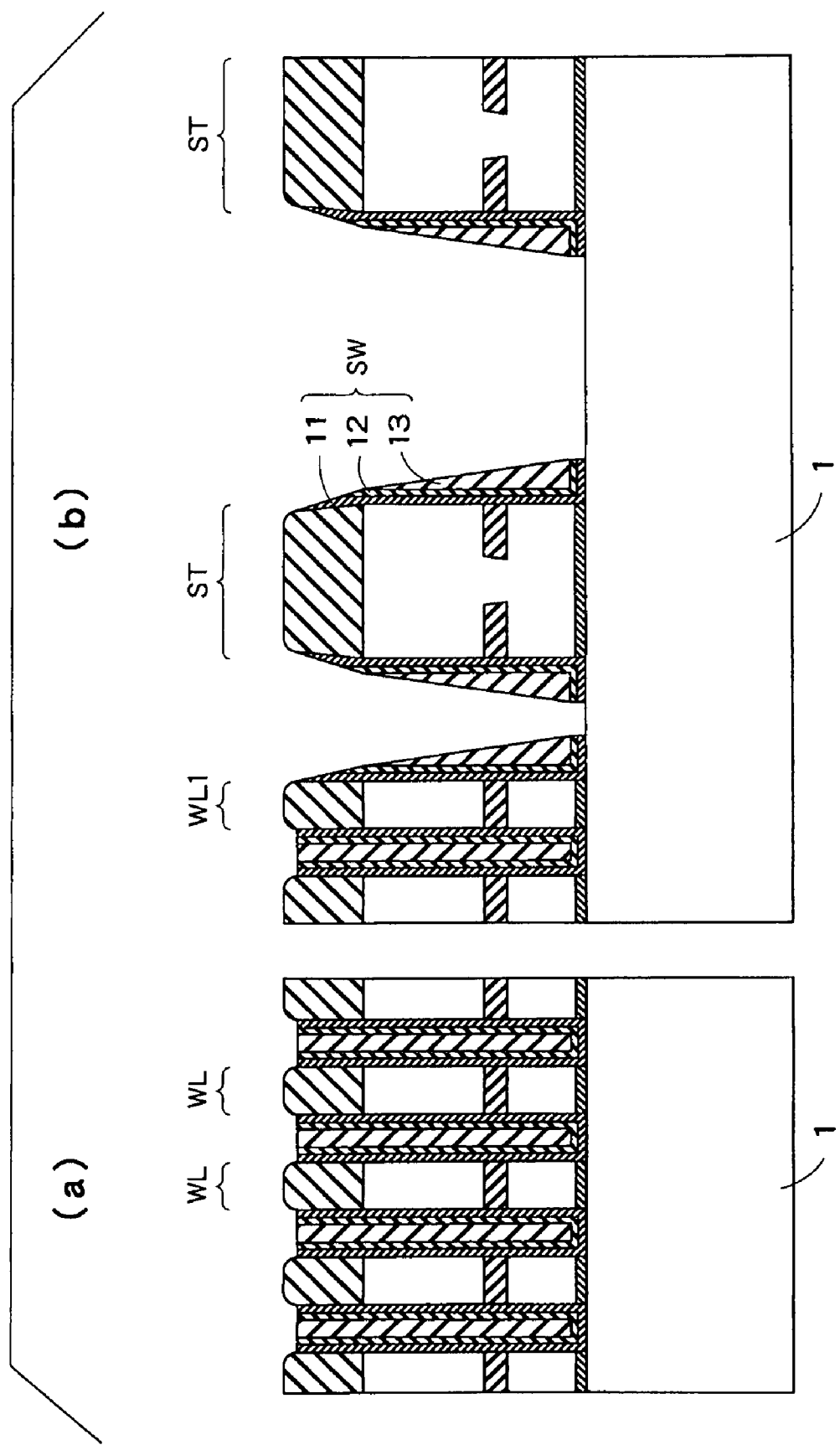
FIG. 3 is a cross-sectional view showing a step subsequent to FIG. 2.

As shown in FIG. 3, etch-back is performed using RIE (Reactive Ion Etching) to expose the surface of the semiconductor substrate 1 between the selection transistors ST and between the selection transistors ST and the word line WL1 adjacent to the selection transistors ST, and the sacrificial film 13, the high-permittivity film 12, and the silicon oxide film 11 are removed.

As a result, sidewalls (sidewall films) SW made up of the sacrificial film 13, the high-permittivity film 12 and the silicon oxide film 11 are formed on sidewall portions of the selection transistors ST and the selection transistor ST side of the word line WL1. A high-concentration diffusion layer (not shown in the drawings) is formed in surface portions of the semiconductor substrate 1 between the selection transistors ST by masking the sidewalls SW and implanting arsenic or the like to form an LDD (Lightly Doped Drain) structure.

Figure 4:
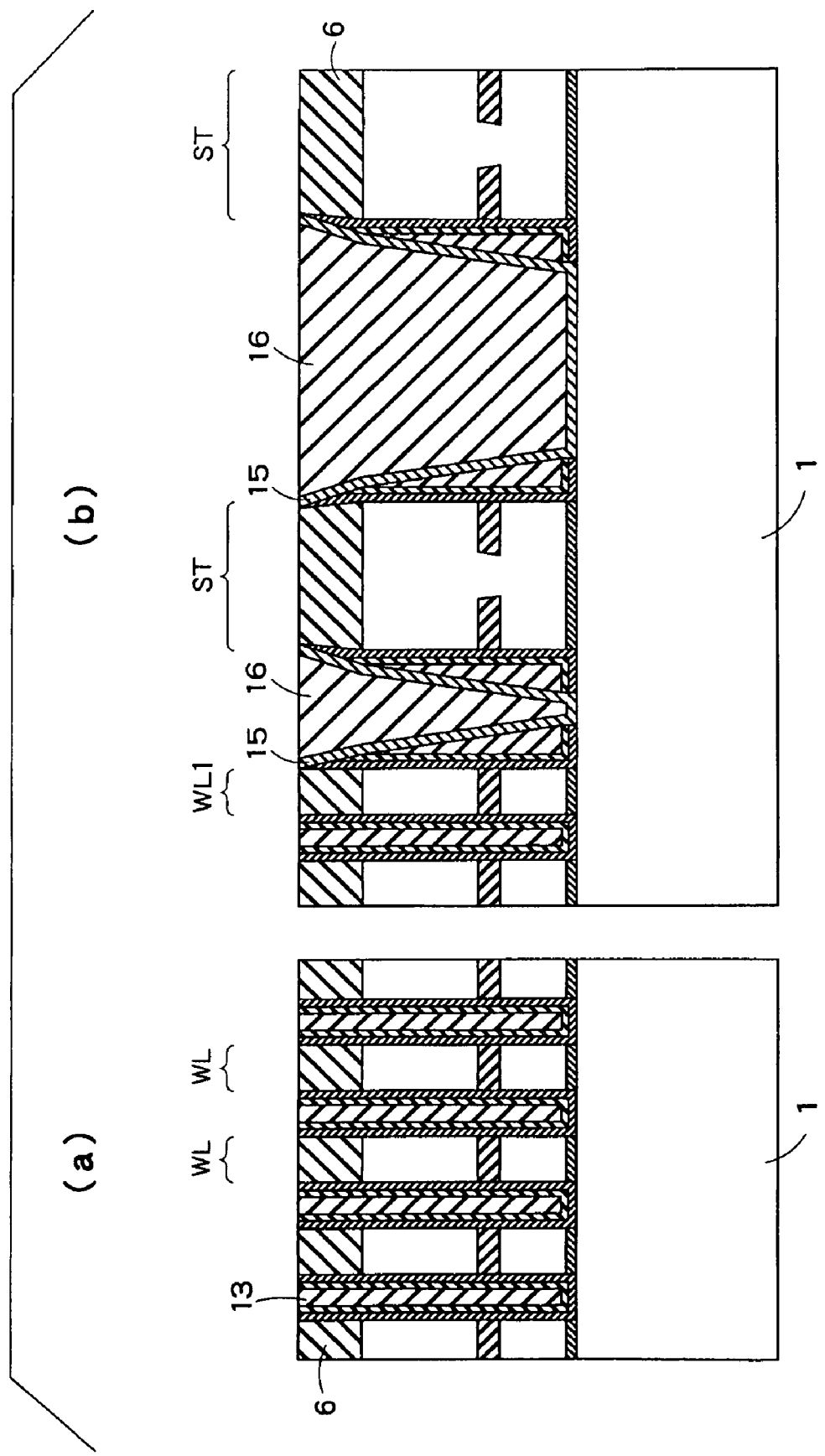
FIG. 4 is a cross-sectional view showing a step subsequent to FIG. 3.

As shown in FIG. 4, a silicon nitride film 15 is formed by an ALD method so as to cover the word lines WL, the selection transistors ST, the sidewalls SW and the semiconductor substrate 1.

Then, a silicon oxide film 16 is formed so as to be embedded between the selection transistors ST and between the selection transistors and the word lines WL1 using a high-density plasma CVD technique which allows a selection ratio of approximately "2" with respect to the sacrificial film 13 to be obtained. As a consequence of using the high-density plasma CVD technique, the silicon oxide film 16 is of a higher density than the sacrificial film 13.

Next, the flattening by CMP (Chemical Mechanical Polishing) is performed with the silicon nitride film 6 as a stopper.

Figure 5:
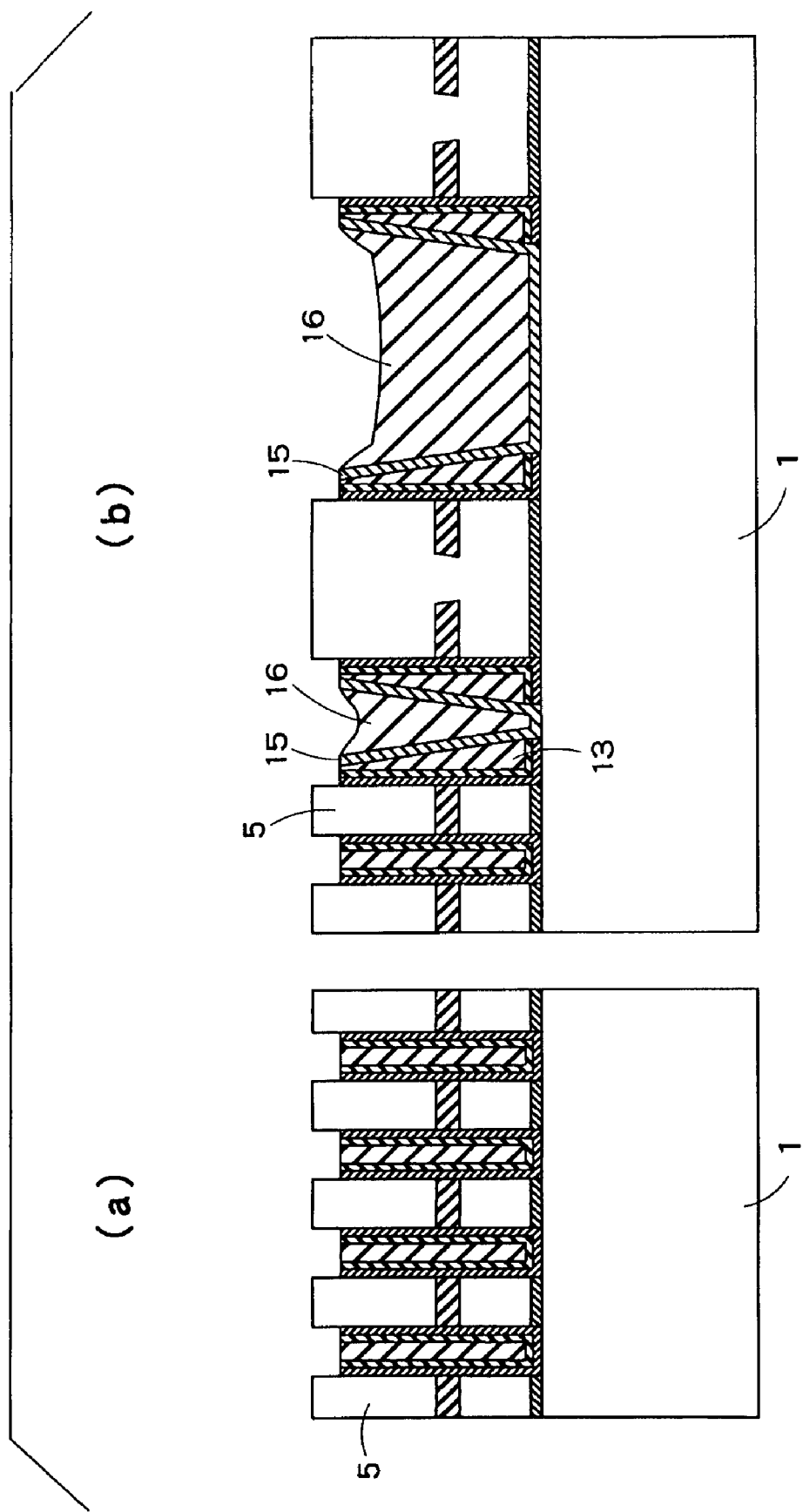
FIG. 5 is a cross-sectional view showing a step subsequent to FIG. 4.

The silicon nitride film 6 is then removed by CDE (Chemical Dry Etching) to expose an upper surface of the control gate electrode 5 as shown in FIG. 5. When the silicon nitride film 6 is removed, a certain amount of the silicon oxide film 16, the silicon nitride film 15 and the like are also removed. At this point, the upper surface of the sacrificial film 13 is exposed.

As shown in FIG. 6, a portion or all of the control gate electrodes 5 are formed from a silicide 17. The silicide metal material can be a transition metal from groups 4 through 11, such as Ni, Ti, Co, Pt, Pd, Ta or Mo.

Next, a resist film 18 is formed, the selection transistors ST are covered, lithography is performed to form openings in the memory cell array portion, and patterning is performed.

Figure 7:
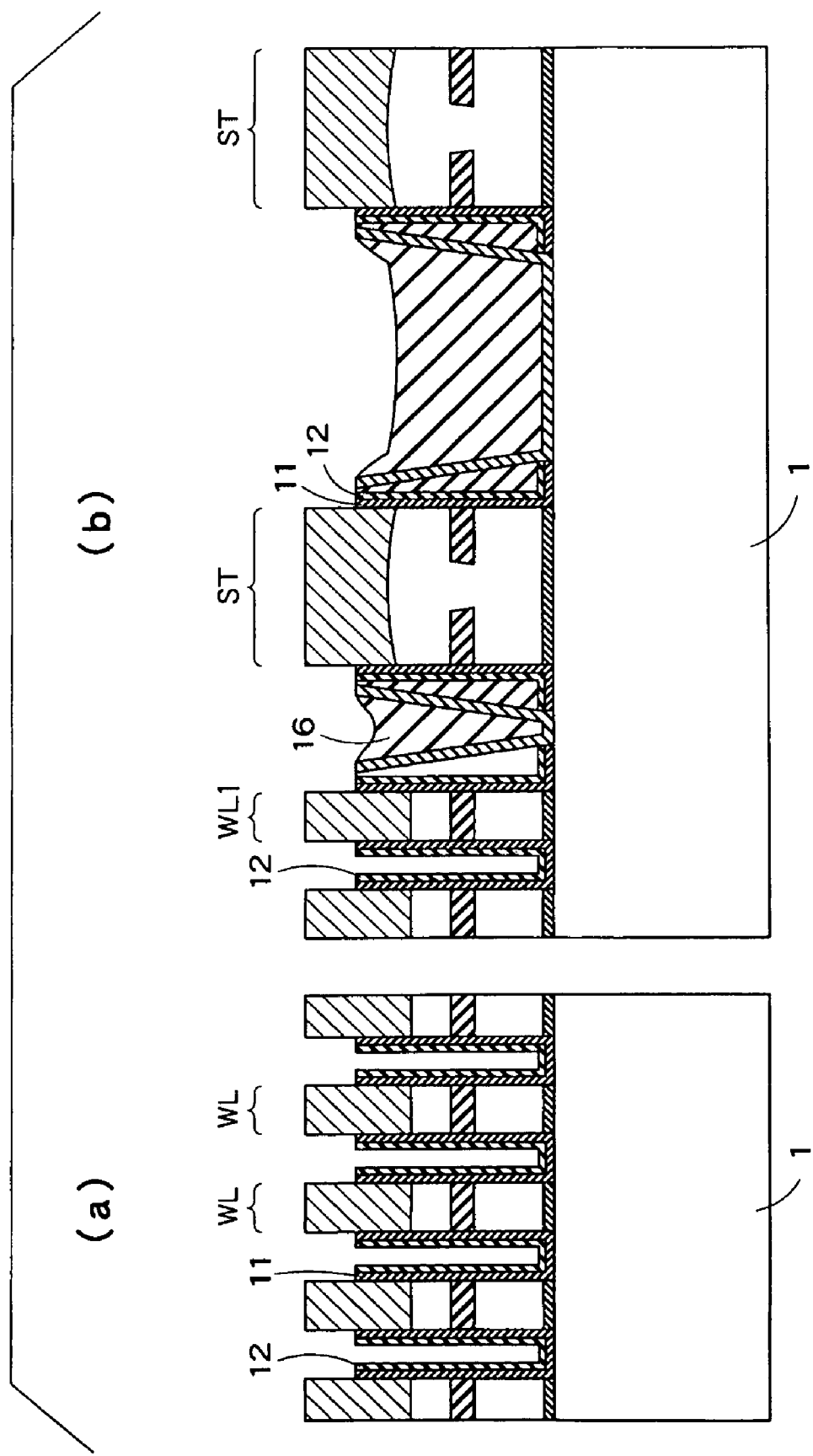
FIG. 7 is a cross-sectional view showing a step subsequent to FIG. 6.

As shown in FIG. 7, the sacrificial film 13 between the word lines WL and the sacrificial film 13 of the sidewall portion on the selection transistor ST side of the word line WL1 are removed by etching for which a selection ratio with respect to the high-permittivity film 12 can be obtained. For instance, a selection ratio between the sacrificial film 13 and the high-permittivity film 12 can be obtained using wet etching with a fluoric acid chemical solution such as BHF (ammonium fluoride: $NH_4F/HF$) or DHF (dilute hydrofluoric acid).

Since the silicon oxide films 11 and 16 have a higher density than the sacrificial film 13 and therefore have a lower etching rate than the sacrificial film 13. Hence, it is possible to obtain a selection ratio between the silicon oxide films 11 and 16 and the sacrificial film 13.

Next, the resist film 18 is removed by ashing and wet etching.

Figure 8:
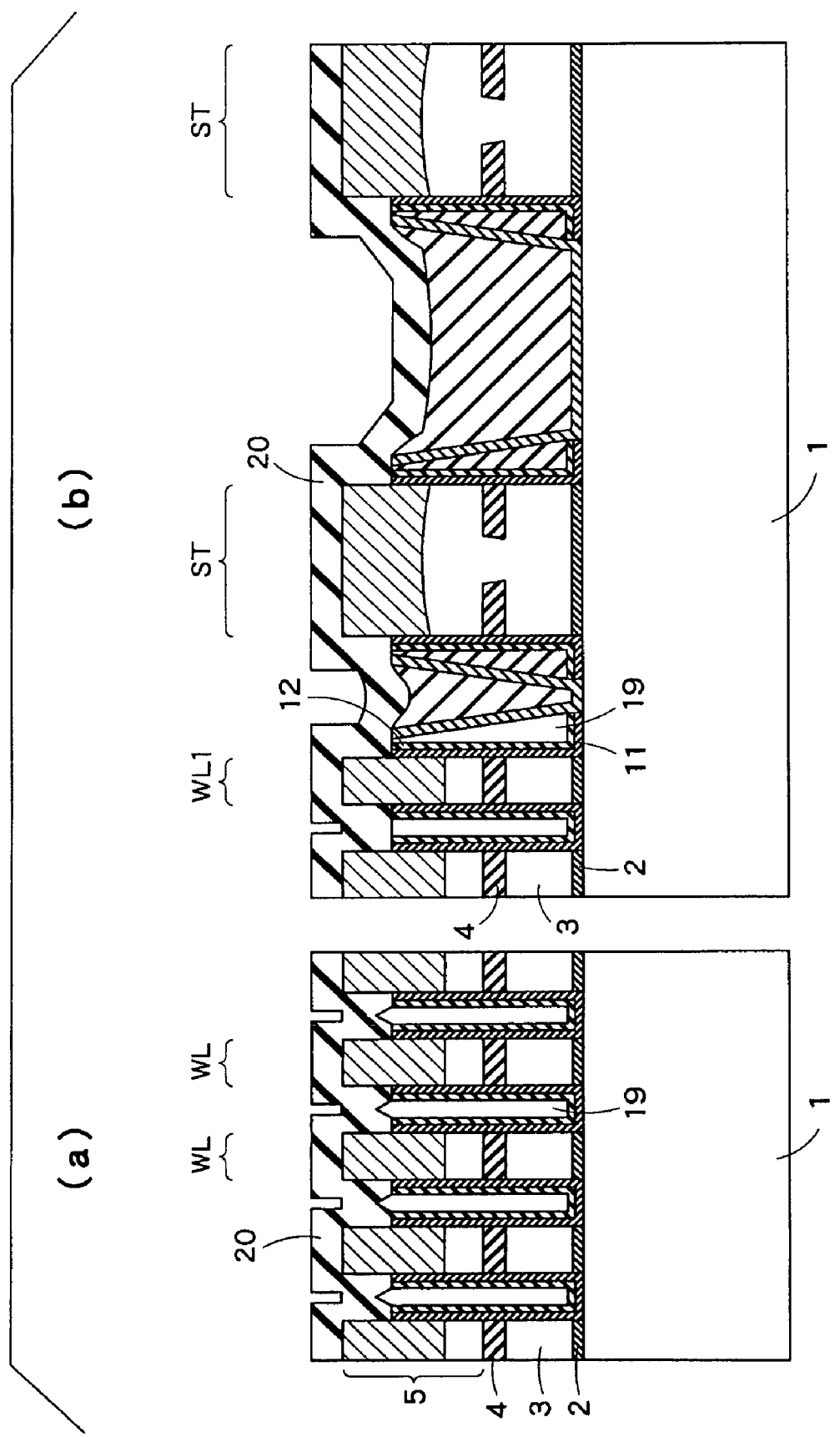
FIG. 8 is a cross-sectional view showing a step subsequent to FIG. 7.

As shown in FIG. 8, the silicon oxide film 20 is formed by a plasma CVD method. Since the plasma CVD method is a deposition method which has poor embedding properties, the silicon oxide film 20 is not embedded in the region from which the sacrificial film 13 has been removed, and the empty portions can be used as air gaps 19.

The semiconductor storage device formed in this way thus has air gaps 19 between the word lines WL, and at the sidewall portion on the selection transistor ST side of the word line WL1 adjacent to the selection transistors ST.

With this arrangement, it is possible to reduce the parasitic capacitance generated between the word lines and increase the operating speed. Further, since the silicon oxide film rather than a nitride film is used as the sacrificial film for forming the spacers and air gaps, it is possible to suppress the generation of hot carriers and degradation of the tunnel oxide film and thereby obtain a highly reliable semiconductor storage device.

Here, it is important to note that a distance between the word lines WL, a film thickness of the silicon oxide film 11 and a film thickness of the high-permittivity film 12 should satisfy the following relationship.

$$\frac{d_A}{\varepsilon_A} + \frac{2d_H}{\varepsilon_H} + \frac{2d_S}{\varepsilon_S} > \frac{d_A + 2d_H + 2d_S}{\varepsilon_S} \qquad \text{[Formula 1]}$$

"$\varepsilon_A$", "$\varepsilon_H$", and "$\varepsilon_S$" are the relative permittivities of the air gap (air), the high-permittivity film 12, and the silicon oxide film 11, respectively.

"$d_A$", "$d_H$", "$d_S$" are the film thicknesses (widths) of the air gap (air), the high-permittivity film 12 and the silicon oxide film 11, respectively.

Figure 9:
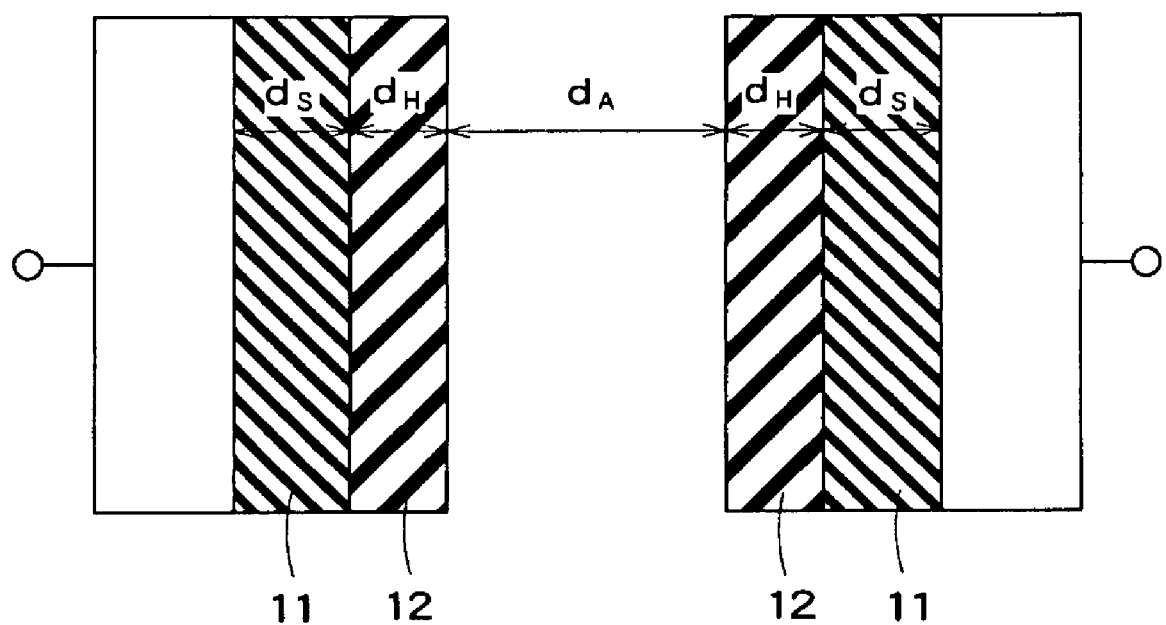
FIG. 9 is a view showing the gap between word lines which are approximated as parallel plates.

The space between the word lines where the air gaps are formed can be approximated as a space between parallel plates as shown in FIG. 9. Under this assumption, the capacitance C between the word lines is a value which satisfies the following formula. Note that "S" denotes the area of the plates.

$$\frac{1}{C} = \frac{d_S}{\varepsilon_S S} + \frac{d_H}{\varepsilon_H S} + \frac{d_A}{\varepsilon_A S} \qquad \text{[Formula 2]}$$

Further, in the case that a silicon oxide film is embedded between the word lines, a capacitance C' is given by the following formula.

$$C' = \varepsilon_S \frac{S}{2d_S + 2d_H + d_A} \qquad \text{[Formula 3]}$$

Since C<C', Formula 1 can be obtained. Hence, by setting the film thicknesses of the silicon oxide film 11 and the high-permittivity film 12 to satisfy Formula 1, it is possible to reduce the parasitic capacitance generated between the word lines WL in comparison to when a silicon oxide film is formed between the word lines WL.

Figure 10:
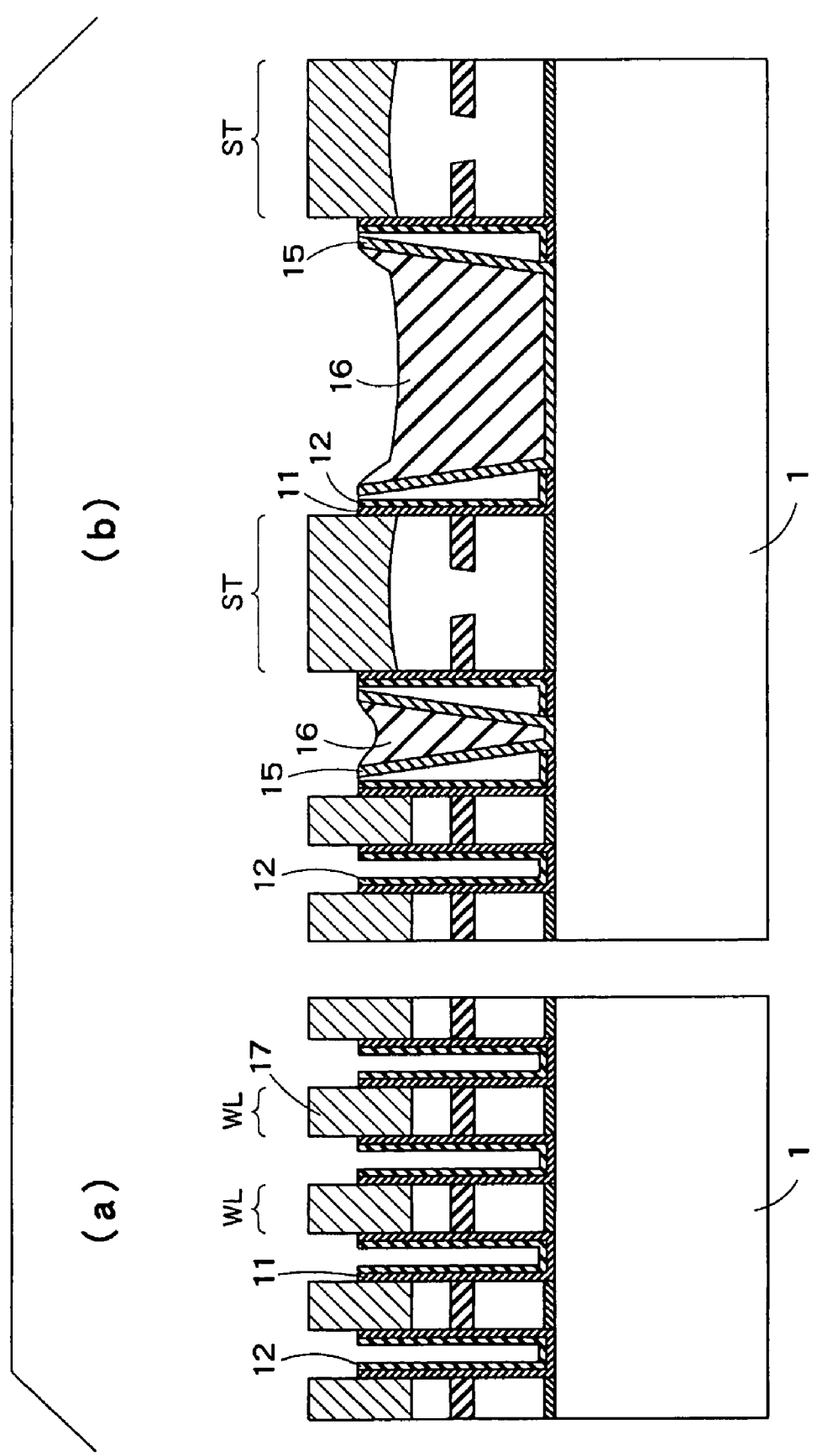
FIG. 10 is a process cross-sectional view for explaining a manufacturing method of a semiconductor storage device according to a modification.

As shown in FIG. 6 and FIG. 7, in the embodiment, a resist film 18 with openings is formed on the memory cell array portion, and the sacrificial films 13 between the word lines WL and on the sidewall portion on the selection transistor ST side of the word line WL1 are removed to form the air gaps in the resulting portions. However, rather than forming the resist film 18, the sacrificial film 13 existing on the sidewalls of the selection transistors ST may also be removed, as shown in FIG. 10.

Figure 11:
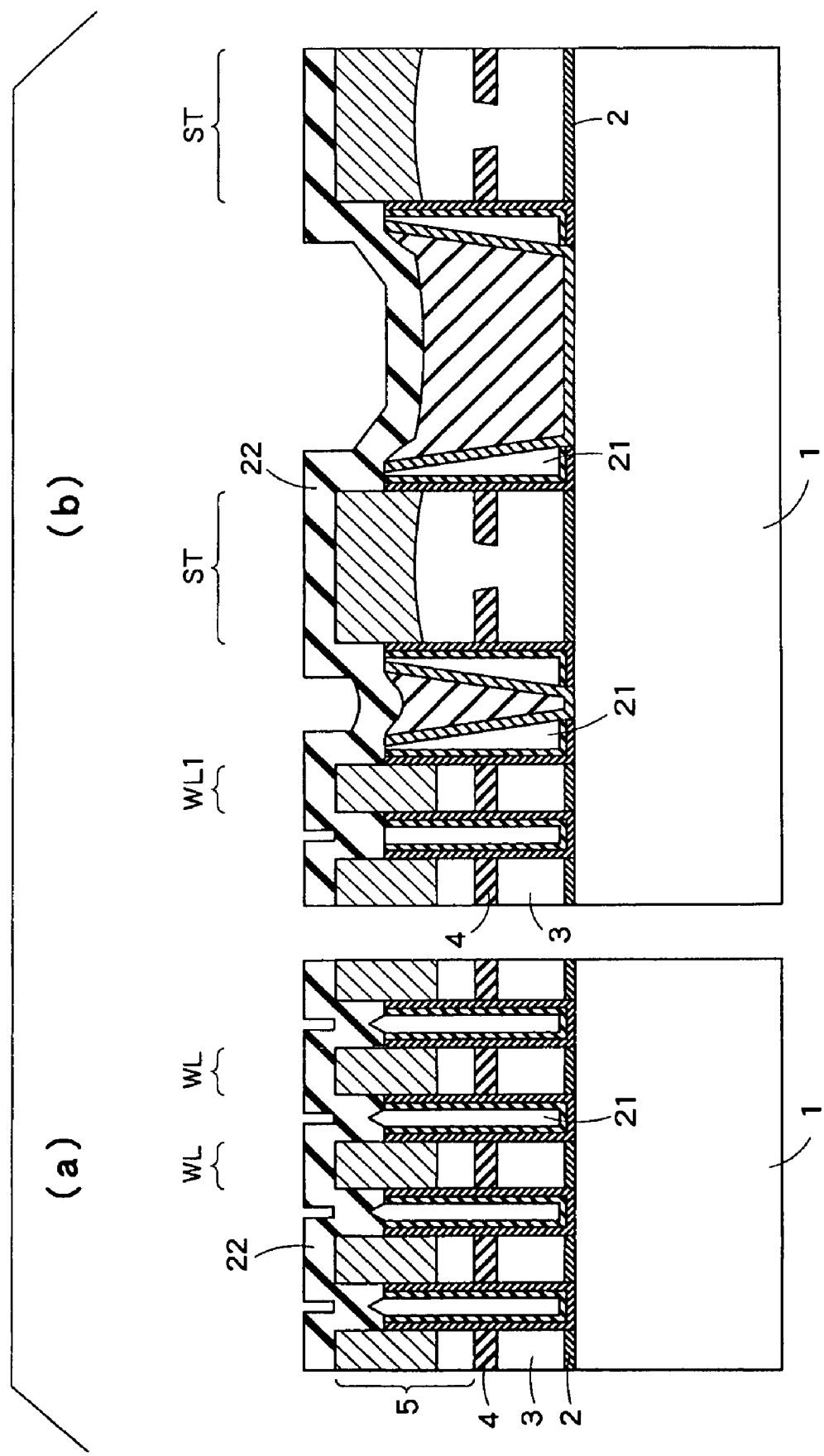
FIG. 11 is a cross-sectional view showing a step subsequent to FIG. 10.

By subsequently forming a silicon oxide film 22 using a plasma CVD method as shown in FIG. 11, it is possible to form a further air gap 21 at the sidewall portions of the selection transistors ST. Since it is possible to omit one of the lithography processes (FIG. 6) used in the above-described embodiment, it is then possible to reduce manufacturing cost by a corresponding amount.

The semiconductor storage device according to the embodiment has a stack-gate memory cell structure formed with a control gate electrode/interpoly insulating film/floating gate electrode/tunnel oxide film stack. However, the air gap formation method can also be applied to an MONOS structure.

When the air gap formation method according to the embodiment is applied to an MONOS structure, a semiconductor storage device of the type shown in FIG. 12 and FIG. 13 is obtained. The semiconductor storage device shown in FIG. 12 has air gaps 110 between the word lines WL and at a sidewall portion on the selection transistor side of the end portion word line WL1. The semiconductor storage device shown in FIG. 13 also has air gaps 110 at sidewall portions of the selection transistors ST. Upper portions of the air gaps 110 are closed off by a silicon oxide film 106.

Here, the word lines WL include a tunnel oxide film 101, a trap nitride film 102, an interpoly insulating film (high-permittivity film) 103, and a control gate electrode 104 which are layered in the stated order. The control gate electrode 104 may be partially or fully formed from a silicide.

The gate electrode 105 of the selection transistor ST is formed using the same processes as the control gate electrode 104. The upper portion of the gate electrode 105 is suicide (partial silicide).

Thus, in the semiconductor storage device with the MONOS structure, the operation speed is improved in the same way as in the above-described embodiment and the resulting semiconductor storage device is highly reliable.

What is claimed is:

1. A semiconductor storage device comprising:
a semiconductor substrate;
a plurality of word lines formed with a predetermined interval on the semiconductor substrate;
a selection transistor provided at an end portion of the plurality of word lines;
a first insulating film formed so as to cover side surfaces of the word lines, a side surface of the selection transistor, and a surface of the semiconductor substrate between the word lines;
a high-permittivity film formed on the first insulation film, the high-permittivity film including a metal oxide and having a higher permittivity than the first insulating film;
a second insulating film formed so as to cover the upper surface of the word lines and the selection transistor;
a first air-gap portion located between the word lines and surrounded by the high-permittivity film and the second insulating film; and
a second air-gap portion formed via the first insulating film and the high-permittivity film at a sidewall portion, which opposes the selection transistor, of the word line adjacent to the selection transistor, an upper portion of the second air-gap portion being covered by the second insulating film.

2. The semiconductor storage device according to claim 1, wherein the plurality of word lines include a tunnel oxide film, a charge storing layer, an interpoly insulating film, and a control gate electrode forming layers in the stated order.

3. The semiconductor storage device according to claim 1, further comprising:
a third insulating film of a lower density than the first insulating film, the third insulating film being formed at a sidewall portion of the selection transistor via the first insulating film and the high-permittivity film and an upper portion of the third insulating film being covered by the second insulating film.

4. The semiconductor storage device according to claim 1, further comprising a third air-gap portion formed at a sidewall portion of the selection transistor via the first insulating film and the high-permittivity film, an upper portion of the third air-gap portion being covered by the second insulating film.

5. The semiconductor storage device according to claim 1, wherein, when a film thickness of the first insulating film is denoted "$d_S$", a relative permittivity of the first insulating film is denoted "$\epsilon_S$", a film thickness of the high-permittivity film is denoted "$d_H$", a relative permittivity of the high-permittivity film is denoted "$\epsilon_H$", a width of the first air-gap portion is denoted "$d_A$" and a relative permittivity of the first air-gap portion is denoted "$\epsilon_A$", the film thickness "$d_S$", the film thickness "$d_H$", and the width "$d_A$" are set to satisfy $d_A/\epsilon_A + 2 \times d_H/\epsilon_H + 2 \times d_S/\epsilon_S > (d_A + 2 \times d_H + 2 \times d_S)/\epsilon_S$.

* * * * *